(12) United States Patent
Akerling et al.

(10) Patent No.: US 6,219,254 B1
(45) Date of Patent: Apr. 17, 2001

(54) CHIP-TO-BOARD CONNECTION ASSEMBLY AND METHOD THEREFOR

(75) Inventors: Gershon Akerling, Culver City; James M. Anderson, Huntington Beach; John W. Spargo, Redondo Beach; Benjamin Tang, Hawthorne, all of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/286,282

(22) Filed: Apr. 5, 1999

(51) Int. Cl.$^7$ ...................................................... H05K 1/18
(52) U.S. Cl. .......................... 361/763; 361/676; 361/678; 361/818; 361/820; 257/737; 257/738; 257/707; 174/250; 174/252; 174/255; 174/260
(58) Field of Search ...................................... 361/763, 676, 361/678, 818, 820, 760, 761; 257/737, 738, 734, 707, 706; 174/250, 252, 255, 260

(56) References Cited

U.S. PATENT DOCUMENTS

| | | | |
|---|---|---|---|
| 5,477,082 | * | 12/1995 | Buckley, III et al. ................ 257/679 |
| 5,583,377 | * | 12/1996 | Higgins, III ......................... 257/707 |
| 5,583,378 | * | 12/1996 | Marrs et al. ......................... 257/710 |
| 5,615,089 | * | 3/1997  | Yoneda et al. ....................... 361/764 |
| 5,717,245 | * | 2/1998  | Pedder ................................. 257/691 |
| 5,767,575 | * | 6/1998  | Lan et al. ............................ 257/701 |
| 5,790,384 | * | 8/1998  | Ahmad et al. ....................... 361/760 |
| 5,866,943 | * | 2/1999  | Mertol ................................. 257/712 |
| 5,919,329 | * | 7/1999  | Banks et al. ........................ 156/281 |

* cited by examiner

*Primary Examiner*—Jeffrey Gaffin
*Assistant Examiner*—David Foster
(74) *Attorney, Agent, or Firm*—Michael S. Yatsko

(57) ABSTRACT

The chip-to-board (or chip-to-MCM) connection assembly and method therefor features a semiconductor chip (31) having a front surface (31f) on which external terminal pads are provided; a board or MCM (32) having a surface (e.g., a recessed surface) at a first side thereof to which the rear surface (31r) of the chip is affixed; and a connection carrier (33), disposed as an overlay, which electrically links the chip and the board or MCM. In this assembly scheme, the connection carrier (e.g., a bump carrier) which is affixed to both the chip and the board or MCM, contains all required signal line tracings (57) to provide the electrical interconnection between the semiconductor chip and the board or MCM. The bump carrier replaces all bond wires (24) and the like and can include support/control circuitry, passive and/or active, associated with, for example, high-speed/high-power IC chips (51). The connection carrier (33) is provided with the electrical contacts (34) such as bump electrodes each interconnecting a contact location (37) at the surface side of the connection carrier facing the semiconductor chip and the oppositely disposed (i) external pad on the chip or (ii) external pad or landing (35) at a side of the board (32) facing the connection carrier (33). Heat generated during operation is released through the rear side of the semiconductor chip (31r), which is affixed to the board or MCM (32).

53 Claims, 9 Drawing Sheets

CHIP-TO-BOARD CONNECTION ASSEMBLY AND METHOD THEREFOR

STATEMENT REGARDING FEDERALLY SPONSORED DEVELOPMENT

This invention was made with U. S. Government support under Contract No. F04606-95-D-0069. The Government has certain rights in this invention.

BACKGROUND OF THE INVENTION

I. Field of the Invention

This invention relates, generally, to the field of semiconductor (IC) technology and to high density semiconductor chip packaging schemes on a board and, more particularly, relates to an improved chip-to-board connection assembly which can enable both high density integration as well as high-speed operation.

II. Description of the Prior Art

Conventional methods of chip attaching schemes, for example, wire bond or flip-chip, have some drawbacks for high density integration and high-speed systems application. Namely, inductance and uncontrolled impedance of bond wires compromises signal transmission integrity and, especially, at the high data rates. As multichip modules (MCMs) or sub-systems become more and more complex, the number of bond wires correspondingly grows. Such expansion in the number of bond wires can be in the thousands. The rise in cost resulting from this becomes an ever greater fraction of the overall assembly cost and, also, leads to a decrease in the reliability of the system.

Most high-performance semiconductor integrated circuit chips require power bypass capacitors which, due to the relatively large values required, cannot, practically, be integrated into the ICs and, therefore, are usually added to the MCM or board assembly. That is, such high value capacitors are installed on the board or MCM externally of the high-performance IC or semiconductor chip. This results in greater expense and in loss of available chip area on the board (e.g. MCM, circuit board [PCB], mounting board, wiring substrate, etc.) and, also, results in greater reliability risk exposure. In fact, even if such bypass capacitors can be integrated into the MCM, for example, this still represents an increase in both cost and reliability risk. This is because the manufacturer (OEM or vendor) must necessarily increase the number of process steps, for example, to provide additional layers to the MCM. Likewise, DC blocking capacitors, which may be necessary, can also represent a significant yield risk to the ICs and so these too would be assembled on the MCM or board thereby further adding to the cost and risk.

Correspondingly, with an increase in the complexity and/or cost of the board (or MCM) assembly, there is a corresponding increase in the need to be able to do rework on the assembly. That is, if a component of the connection assembly fails, the MCM assembly must facilitate the replacing of that component. Otherwise, the cost and schedule invested in the manufacture of the overall module will be lost.

IC mounting boards and, especially, high-speed digital circuit boards (e.g., high-performance MCMs) must provide solutions to separate, and sometimes incompatible, problems. For one, in order to maintain high bandwidth, interconnection of chips should be effected through controlled impedance paths and with few discontinuities. Also, latency and data skew concerns dictate -that these controlled impedance paths must be as short as possible. However, as operating speeds (e.g., chip clock rates) as well as semiconductor chip complexities increase, the power requirements of such chips correspondingly increase, which leads to a further requirement for an efficient thermal management to dissipate the heat being generated by this power. Thermal management requires a large portion of the chip surface to be in intimate contact with a good thermal conductor having sufficient thermal mass to remove the heat generated by the chip.

With regard to chip attaching schemes such as ones which employ wire bonds or ribbon bonds, efficient heat dissipation is afforded through the back or rear surface of the chip or die. This can be seen from FIG. 2 of the drawings which is illustrative of one such conventional approach of chip-on-board design for efficient thermal management. This illustration exemplifies efficient thermal management by placing the back side of the chip 21 in contact with a thermal conductor 22 which can be of any well-known conductive material (e.g., Cu metal or Cu—W metal alloy, etc.). Such a design scheme as that shown in FIG. 2 does provide for a separation of the electrical and thermal pads, with the purpose of optimizing the thermal management of the heat being dissipated by the chip. In this connection, the wirings on the board including the interconnection of the wire or ribbon bonds 24 are effected on the board dielectric and interconnect portions 23, which may have one or more wiring layers. 25 on chip 21 represents the bonding pads (or external terminal pads) of the chip.

The example shown in FIG. 2 and the like does provide for effective thermal management of heat dissipation associated with high-power/high-speed semiconductor chips. The method of interconnection used, however, typically has larger amounts of discontinuities than are desirable, requires additional area between chips leading to longer interconnect pads, and only allows the formation of I/O (input/output) bonding pads at the outer periphery of the chip, which leads to compromises in the electrical design. Such conventional approaches to chip-to-board attaching schemes leads to wire inductances and uncontrolled impedances of bond wires which compromises signal integrity, especially, at the high data transmission rates. This, of course, compromises the ability to increase the data transmission speed. Also, the ability to perform rework and repair is limited by the number of times wire bonding can be done to the pads on the board.

Pulling bond wires and the like can be arduous; tails can remain after the bond wires are pulled and wire lands or pads can be ruptured, all of which can greatly complicate the rework process. This would be compounded by the fact that a finished connection assembly (resulting from rework) is rarely as clean and robust as the original work and so reliability can suffer. An entire module may necessarily be scrapped even for the loss of a single wire land that happens to be too badly damaged in an attempt to replace a bond wire. Reference to a bond wire is strictly for discussion only. Such wiring can be any type of wire bonds or, for that matter, ribbon bonds or tape automated bonding (TAB). Increasing the number of times a chip can be replaced usually leads to compromises in the electrical design of the chip (pad size, number of pads, line spacing, etc.).

Flip-chip technology can solve some of the problems associated with signal integrity, assembly, and rework attributed to use of bond wires and the like for connecting the chip to the board (e.g., MCM). However, integrated circuit (IC) technologies that require a high bandwidth capability are known to consume a great deal of power and, therefore, generate a considerable amount of heat when operating. Such heat would be more effectively removed from the rear surface of such a high-power and/or high-speed chip (or die). That is, front side heat removal, which would be the case if the device is mounted as a flip-chip, is not a feasible option, for example, in high-speed devices such as GaAs ICs and the like due in part to the presence of air bridges, controlled impedance structures, and increased parasitic capacitance to the devices and their interconnect. When you have both high-power and high-speed requirements of IC chip construction, the process of forming wirings becomes quite troublesome and it becomes quite difficult to provide a flip-chip construction scheme.

Flip-chip technology is known to be an excellent way for achieving high bandwidth interconnection. FIG. 1 of the drawings shows comparisons of inductive discontinuities between various technologies. Lower lead inductance allows higher bandwidth signal transmission. Flip-chip technology also allows closer spacing of chips for more compact boards and with shorter interconnect paths between chips. Also, flip-chip mounting allows connection of all of the chip pads to the board or MCM in a single step, thereby increasing the reliability and lowering the cost of assembly. Furthermore, through the use of flip-chip technology, interconnections of chips are effected through controlled impedance paths and with few discontinuities, in contradistinction with that typically associated with conventional chip-to-board connection schemes such as wire or ribbon bonding and the like. However, IC technologies capable of high bandwidth are known to consume a lot of power and generate a considerable amount of heat which is most effectively taken out from the rear side of the die. As noted earlier, front side heat removal is not an option in high or very high-power devices and/or high-speed devices such as HBT (heterostructure bipolar transistor) devices, heterostructure FET devices, GaAs ICs, etc., and the like, when connected as flip-chips. Also, if the semiconductor chips on the MCM or board have both high-power and high-speed requirements, thereby generating a substantial amount of heat during operation, the propensity for wire problems would generally preclude a standard flip-chip mounting.

One method available for efficient thermal management and, at the same time, providing a high bandwidth interconnect network is to mount the chips on a thermal conductor (or heat sink) similarly as that shown in FIG. 2 of the drawings, and then deposit or apply the layers of dielectric and metal, for example, including through employing lithography processes to implement the high-speed controlled impedance interconnect. Although such a method has the advantage of separating the thermal paths from the electrical paths and thereby avoiding wiring problems on the chip as well as optimizing each, it is not conducive to rework should modifications or repairs be required. Further, such a method requires development of multi-step processings in order to reliably complete the chip-to-board assembly.

SUMMARY OF THE INVENTION

It is a main objective of the present invention to provide an improved chip-to-board connection assembly and method therefor which overcomes the limitations/drawbacks discussed above as well as other limitations related to chip-to-board connection assemblies, the board, although not limited thereto, being inclusive of a multichip module (MCM), a chip mounting board (PCB), a wiring substrate having one or more layers of wirings mounted on a base (e.g., a thermal conductor base which may be inclusive of a heat sink, metal plate, etc.), and so forth.

Another objective of the present invention is to provide an improved chip-to-board connection assembly and method therefor that ameliorates or eliminates the signal integrity issues including providing low inductance or controlled impedance interconnect for achieving good signal integrity.

A further objective of the present invention is to provide a chip-to-board connection assembly and method therefor which also reduces the assembly complexity. In this connection, the inventors' improved scheme minimizes assembly complexity addressing mechanical issues such as alignment of components, selection of materials, process yield as well as inspectability.

It is a still further objective of the present invention to provide an improved chip-to-board connection assembly and method therefor which supports the mounting of a large number of chips and chips with an increased number of pads without driving up assembly costs and lowering unacceptably the reliability and which minimizes assembly complexity of supporting discrete components, for example, active and/or passive elements including bypass and DC blocking capacitors.

Still further, it is an objective of the present invention to provide for an improved chip-to-board connection assembly and method therefor which affords low thermal resistance to support high-power/high-speed chips.

Moreover, it is an objective of the present invention to provide an improved chip-to-board connection assembly and method therefor which facilitates rework, i.e., allows for replacement of chips and components with minimal loss/risk.

To achieve the above objectives, the present inventors have determined that what is needed is an improved chip-to-board (or chip-to-MCM) interconnection scheme that ameliorates or eliminates the signal integrity issues, reduces the assembly complexity, allows rework, and extends the chip in the vertical or "Z" direction. Such an interconnection scheme must embody a very high degree of component and controlled impedance interconnect integration. Although flip-chip technology would solve the problems of bond wires and rework, the inventors have determined, flip-chip is also a very poor means of heat sinking high-power ICs. Inventors have achieved the objectives through effecting a chip-to-board connection assembly and method therefor such that it does facilitate heat sinking capability of the semiconductor chips which is especially desirable in the high-power/high-speed ICs while, at the same time, allowing for a very high degree of component and controlled impedance interconnect integration. Such is achievable through providing a connection carrier (e.g., bump carrier) as an overlay which electrically links the semiconductor chip and the board. Specifically, all bond wires and discrete capacitors around each of the semiconductor chips (e.g., high-performance semiconductor chips) are replaced with a single element, namely, a connection carrier (e.g., bump carrier). The bump carrier contains all required signal traces which provide the electrical interconnection between the semiconductor chip and the board (e.g., MCM). All the required bypass and DC blocking capacitors can also be fabricated in such bump carrier and are now positioned directly above and/or adjacent to the requisite pads of the semiconductor chip to which the bump carrier is attached. In addition to this, control or other support circuitry associated with operation of the high-power/high-speed semiconductor chips can also be separately disposed as electrical components in the connection carrier rather than being included, for example, in the high-power/high-speed chips.

The provision of such a connection carrier (e.g., bump carrier) as an overlay above the front surface of the high-performance semiconductor chips allows a safe release of the heat which is generated during operation through the rear surface side of the semiconductor chip. This is achieved by affixing the rear surface side(s) of the semiconductor chip(s) to the board or MCM surface itself. That is, the provision of the connection carrier (e.g., bump carrier) has the effect of reducing the overall complexity of the semiconductor chip, the semiconductor chip being, typically, a high-performance chip, although not limited thereto. Also, thermal management can be safely and effectively provided through the rear surface side of the semiconductor chip(s). Such assembly construction avoids problems such as wire melt-down and other defects that would result otherwise during heat build-up in flip-chip mounted high-performance chips. Also, the level of integration or chip yield associated with the individual high-performance chips can be significantly increased, according to the present invention. Such overlay connection schemes, unlike bond wire schemes and the like, also allow the pads to be provided throughout the chip area (front areal pads as opposed to peripheral pads) which also allows for a higher I/O count as well as a more efficient placement of ground or return lines to assure high bandwidth performance and little disturbance without increasing the chip size. Additionally, the placement of the connection carrier or bump carrier as an overlay connector (e.g., flip-chip connector) allows closer spacing of the chips on the board and with shorter interconnect pads between chips. Also, the flip-chip connection scheme of the present invention allows connection of all of the chips to the board in one step, thereby increasing the reliability as well as lowering the costs of assembly.

Through the provision of a connection carrier and electrical contacts associated therewith (e.g., solder bonds, etc.), there is a significant improvement in terms of controlling impedances of wirings when compared with wire or ribbon bonds and the like and, also, the size and effectiveness of the capacitors are dramatically improved. The connection carrier which electrically links the semiconductor chip and the board (or MCM) employs electrical contacts each of which effects an interconnection between the contact location (e.g., contact pads) provided at a surface side of the connection carrier facing the semiconductor chip and the oppositely disposed (i) external pad on the semiconductor chip or (ii) external pad or landing at a side of the board (or MCM) facing the connection carrier. Although bump electrodes (e.g., solder bumps) are considered highly desirable as the electrical contacts, the present invention is not necessarily to be considered as limited thereto. For example, other types of electrical contacts which provide stable/rigid contacts and conform to the above objectives can be employed in affixing one or more vertically arranged carrier overlays including, for example, bonded interconnect pins (BIP), etc. However, based on present available solder re-flow technology and advantages thereof, bump electrodes are especially highly desirable, as can be seen with regard to the illustration in FIG. 1 of the drawings.

To summarize, the improved chip-to-board (or MCM) connection assembly features a semiconductor chip having a first principal surface (or front surface) on which external terminal pads are provided; a board (or MCM) having a surface (e.g., a recessed surface) at a first side thereof to which a second, opposing principal surface (or rear surface) of the semiconductor chip is affixed; and a connection carrier (e.g., bump carrier) which electrically links the semiconductor chip and the board. In accordance with this scheme, the connection carrier is affixed to both the semiconductor chip and the board via electrical contacts (e.g., bump electrodes) wherein each electrical contact effects an interconnection between the contact location provided at a side of the connection carrier facing the semiconductor chip and an oppositely disposed (i) external pad on the chip or (ii) external pad or landing at a side of the board facing the connection carrier. In accordance with this scheme, the heat generated during operation of the semiconductor chip is dissipated through the second principal surface (or rear surface) of the chip. In this connection, the board is facilitated so as to have both wirings as well as act as a heat sink.

In accordance with the present invention, also, the connection carrier (e.g., bump carrier) includes wirings which electrically interconnect the semiconductor chip and the board (or MCM) through the electrical contacts (e.g., bump electrodes or solder bumps, etc.). According to another featured aspect, the bump carrier is constituted by a substrate having at least one wiring layer and electrical components, including active and/or passive elements, associated with operation of the semiconductor chip. An example of this (although not limited thereto) is to place the wire tracings and buffer/controller portion of the high-performance chip which may operate at relatively lower speed/power requirements than that associated with the high-power/high-speed portion of the high-performance chip on the bump carrier. Noting that the former typically represents a significant, if not a majority, of the chip area of the high-performance devices, implementing the same on the bump carrier would significantly improve the yield on the high-performance chips.

According to another featured aspect of the invention, the bump carrier can be made from material selected from the group consisting of silicon (Si), sapphire ($Al_2O_3$), KAPTON (a trademark for a flexible polymer film available from DuPont), TEFLON (a trademark for polytetrafluoroethylene, available from DuPont), germanium (Ge) and mixtures thereof. Also, the bump carrier can be effected using either polycrystalline or monocrystalline material. Still further, the bump carrier can be constituted by a flexible film as a substrate, a thin film as a substrate or a thick film as a substrate. In fact, the bump carrier can be made by any well-known material and can also be an integrated circuit chip itself having wirings (tracings) which effect an electrical link between that of the semiconductor chip (on the board) and the board and can also have buffer/controlling circuitry associated with operation of the semiconductor chip. It is emphasized, the choices of materials with respect to the bump carrier and/or board or MCM used in realizing the invention are not to be construed as being limited to that mentioned in this specification.

It is also emphasized, the inventors' improved chip-to-board (or MCM) connection assembly and method therefor are not limited to high or very high-power/high-speed chips but, rather, are applicable to any IC chips in general noting that the flip-chip connection scheme of the present invention would ameliorate or eliminate the signal integrity issues as well as reduce, considerably, assembly complexities over similar such IC chips which would otherwise employ wire bonds and the like or strictly employ flip-chip mounting technology. In fact, the present invention is applicable to situations where the semiconductor chips as well as the bump carriers are formed from the same or different materials.

Another featured aspect of the invention is that the present invention is not necessarily limited to a single bump carrier being used for interconnecting the semiconductor chip to the board (e.g., MCM). In fact, several bump carriers may be required to interconnect a single IC to the board or, alternatively, a single bump carrier may be used to interconnect several semiconductor chips to the board.

One of the featured advantages resulting from the present invention is that rework of the assembly is feasible and even easy. That is, rework can be accomplished in a similar way as is done today for single chips flipped on an MCM, for example.

According to the present invention, the chip-to-board connection assembly can be implemented in several ways.

In accordance with one attachment scheme, the semiconductor chip, the connection carrier and the board (e.g., mounting board or MCM) are separately provided by the manufacturer through well-known fabrication schemes. The connection carrier (e.g., bump carrier) is specifically designed to electrically link the board to the semiconductor chip (e.g., high-performance chip or, for that matter, any specified chip or die structure). The semiconductor chip is provided with a first principal surface (or front surface) on which external terminal pads are provided, the connection carrier has a surface at a first side thereof on which electrical contacts (e.g., solder bumps) are provided and the board (mounting board or MCM) has contact pads or landings and has a recessed opening within an inner surface to which a second, opposing principal surface (rear surface) of the semiconductor chip is to be affixed. In accordance with this first method, the second principal surface (or rear surface) of the semiconductor chip is affixed first to the inner surface of the recessed opening at a first surface side of the board; and according to a further step, the connection carrier (or bump carrier) is affixed to both the first principal surface (or front surface) of the chip and the board in a manner which electrically links the semiconductor chip and the board. This method calls for using the electrical contacts (e.g., solder bumps, etc.) to affix the first side of the connection carrier to both the principal surface of the semiconductor chip and the board in a manner in which each such electrical contact effects an interconnection between a contact location at the first side of the connection carrier facing the semiconductor chip and an oppositely disposed (i) external pad on the chip or (ii) contact pad or landing at a side of the board facing the connection carrier.

Alternatively, rather than first affixing the rear surface of the semiconductor chip to the recessed inner surfaces of the board, the first principal surface (or front surface) of the semiconductor chip is instead affixed to the first surface side of the connection carrier (the first surface side of the connection carrier being provided with the electrical contacts). Upon completion of this step, both the second principal surface (or rear surface) of the semiconductor chip and the connection carrier are affixed to the board in a manner which electrically links the chip and the board. This second method also uses the electrical contacts (e.g., solder bumps, etc.) that are provided on the first surface side of the connection carrier to affix the front surface of the chip to the connection carrier and, subsequently, to affix the connection carrier to the board. Affixing the rear surface of the chip to the board can be achieved through any well-known bonding scheme. Although the two methods are somewhat different, they are both applicable in connection with achieving the chip-to-board connection assembly of the present invention.

The present invention also makes it possible to vertically assemble an arbitrary number of monolithic components (e.g., a plural vertical arrangement of bump carriers disposed as a multi-level carrier overlay above a chip or die and together are affixed to a board [MCM]) with the proviso that only the bottom component can have an adequate thermal path; the bottom component can typically be a high-performance semiconductor chip or die or, for that matter, any semiconductor device (e.g., chip or die).

It should also be clearly understood that the dimensions of both the semiconductor chip(s) and the corresponding bump carrier(s) determine(s) the mounting board or MCM openings, where such openings are required. That is, the board or multichip module is provided with individual openings (or recessed openings) each of which is associated with a sub-assembly including one or more semiconductor chips and corresponding bump carrier overlay(s) for attaching the chip(s) of that sub-assembly to the appropriate board or MCM landings. That is, the dimensions of the semiconductor chip and carrier are specified so that the mounting board or MCM is provided with recessed openings that are dimensioned so that the chip and carrier overlay fit appropriately, that is, the chip and carrier are appropriately retrofitted into the recessed opening of the board or MCM.

These and other featured aspects and advantages therefor of the present invention, which is defined by the appended claims, will become better understood with regard to the following detailed description as it relates to the exemplified embodiments.

BRIEF DESCRIPTION OF THE DRAWINGS

FIGS. 9A and 9B are schematic illustrations of top plan views depicting a chip-to-board connection assembly in which FIG. 9A shows a single flip-chip connector overlay for electrically linking a pair of chips to the board or MCM and in which FIG. 9B shows two flip-chip connector overlays associated with a single chip.

DETAILED DESCRIPTION OF THE DRAWINGS

Figure 1:
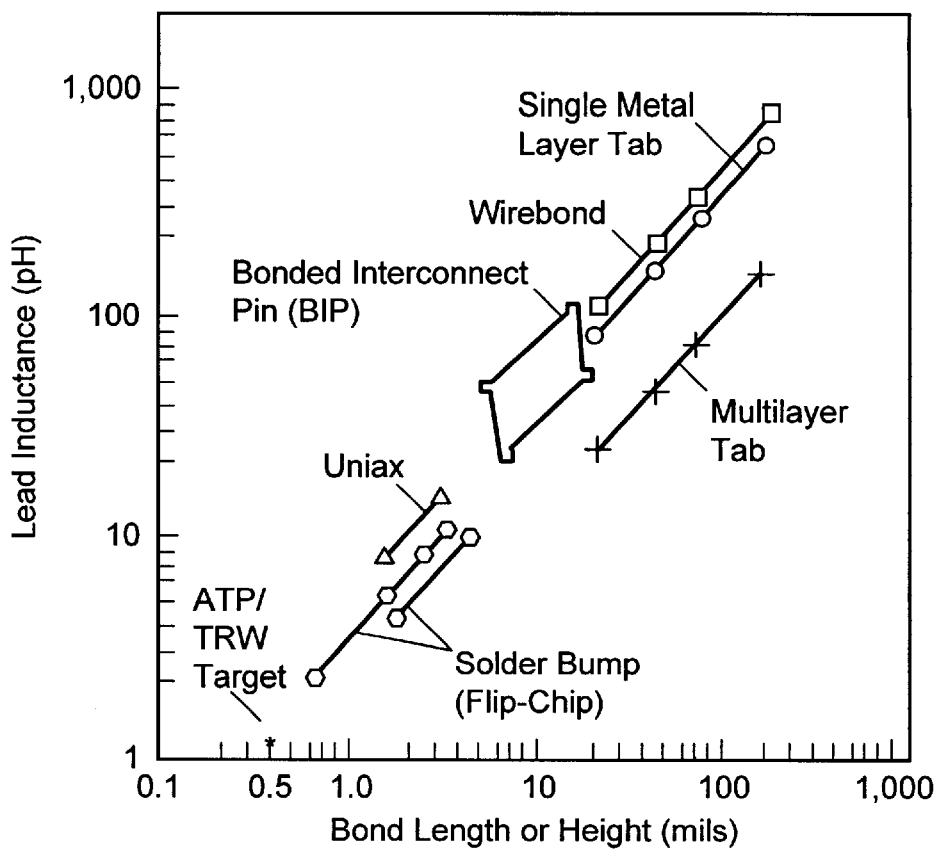
FIG. 1 is a graph illustration which compares various chip-to-board- connection technologies.
Figure 2:
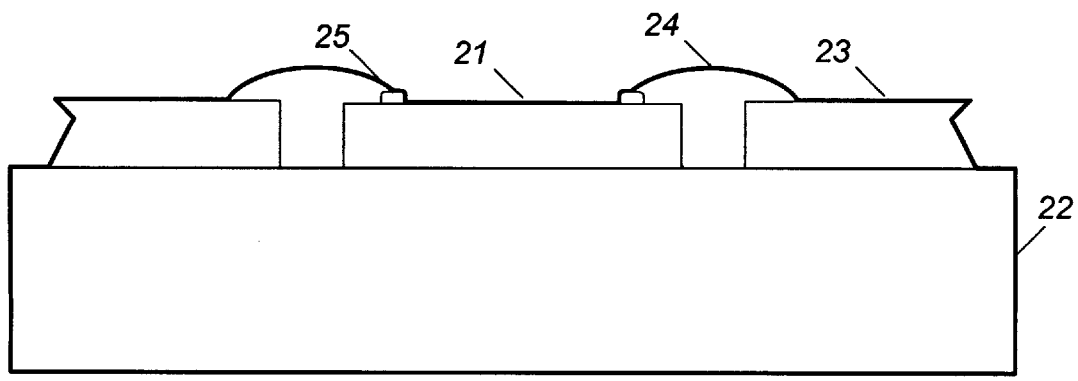
FIG. 2 is a side sectional view illustrating a conventional approach of chip-on-board design for efficient thermal management.
Figure 3A:
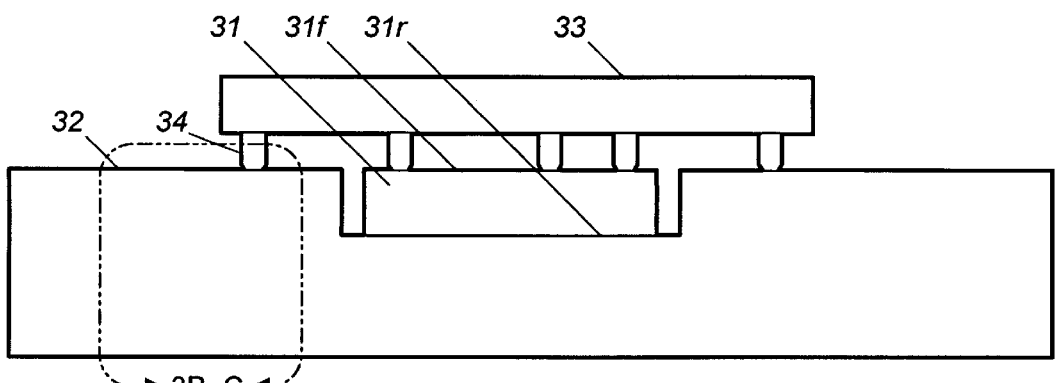
FIG. 3A is a schematic illustration of a side sectional view of a chip-to-board connection assembly according to one embodiment.
Figure 3D:
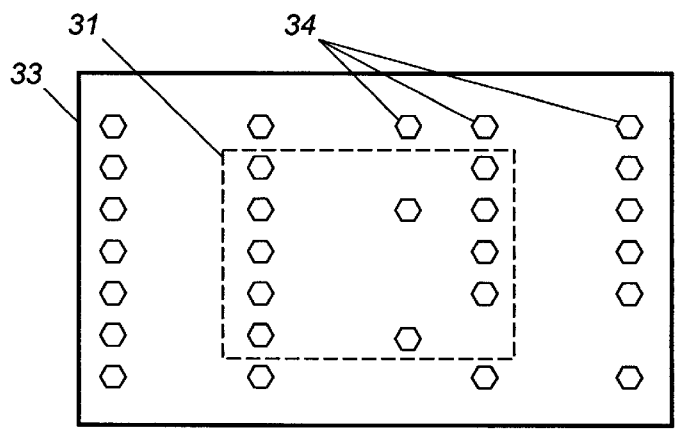
FIG. 3D is a schematic illustration, for purposes of discussion, of a plan view layout of the contact electrodes of the connection carrier according to the present invention.
Figure 3B:
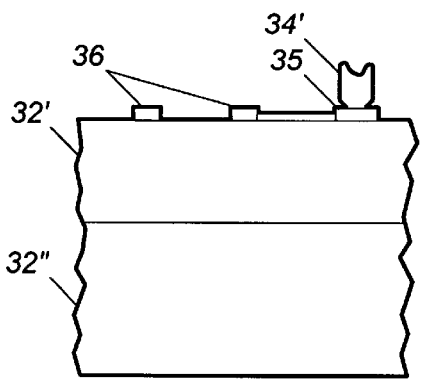
FIGS. 3B and 3C are alternative exploded views typifying parts 3B and 3C of FIG. 3A respectively.
Figure 3C:
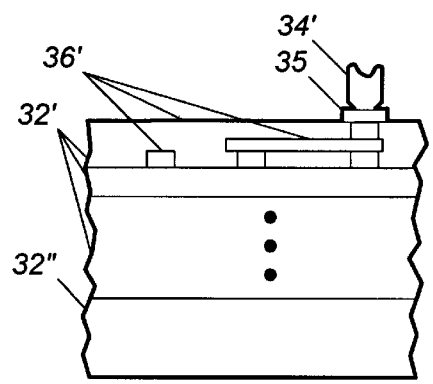

FIG. 3A of the drawings is illustrative of a side sectional view of a chip-to-board connection assembly according to one exemplary embodiment of the present invention. In this illustration, 31 represents a semiconductor chip the rear surface of which 31r is affixed to a surface (e.g., an inner contact surface of a recessed opening) at a first side of board 32. The connection carrier (e.g., bump carrier) is disposed over both the semiconductor chip 31 and board 32 in a manner which electrically links the semiconductor chip and board. The connection carrier is an overlay which is affixed to both the front surface 31f of semiconductor chip 31 and board 32 via electrical contacts, for example, bump electrodes, such as solder re-flow bumps, although not limited thereto. Each such electrical contact effects an interconnection between the contact location (e.g, contact pad) at a side of the connection carrier facing the semiconductor chip and an oppositely disposed (i) external pad on the chip or (ii) external pad or landing at a side of the board facing the connection carrier. The board, as described earlier, can be any well-known mounting board, wiring board (e.g., PCB), MCM, etc. As one example, the board can be constituted by a wiring substrate having one or more layers of wirings on a thermal conductor/heat sink to which the rear surface 31r of the semiconductor chip is affixed. The chip can be affixed to the thermal conductor/heat sink portion of the board by any well-known bonding scheme which allows good thermal contact (e.g., epoxy, eutectic, solder, etc.). The wiring portion of the board is typically constituted by a dielectric having one or more wiring layers. The dielectric can be a ceramic, thin-film or thick-film substrate, etc. FIG. 3B is an example of an exploded view typifying part 3B of FIG. 3A of the drawings. FIG. 3B exemplifies a board which has both the landings 35 and wirings 36 on the surface thereof, reference 34' represents the contact electrode (e.g., bump electrode) affixed to the landing 35. Reference 32' represents the dielectric portion (e.g., ceramic, KAPTON™, etc.) and 32" represents the thermal conducting portion of the board (e.g., Cu metal, Cu—W metal alloy, Al metal, etc.). FIG. 3C is an alternative exploded view of a similar portion 3C in FIG. 3A of the drawings whereby the board is constituted by a dielectric portion 32' having at least one wiring layer as well as a heat conducting portion/heat sink 32". In FIG. 3C an example is given of the uppermost wiring layer in which 36' represents the wirings, 35' represents the board landing and 34' represents the contact electrode (e.g., bump electrode).

This connection assembly not only avoids the drawbacks associated with wire bonds and the like but, also, avoids signal integrity problems especially at high data rates resulting from the inductance and uncontrolled impedances of bond wires. The bump carrier overlay 33 not only replaces all bond wires but, also, can include all active and or passive components associated with controlling the operation of the semiconductor chip or die that, otherwise, would take up a large area portion of the chip or die or in the case of bypass and DC coupling capacitors, those capacitors would typically be formed outside the chip, namely, on the board or MCM itself.

By disposing the connection carrier or bump carrier as an overlay in the manner as that shown in FIG. 3A or, for that matter, with regard to any of the other illustrations, the level of integration or chip yield associated with an individual semiconductor chip or die (e.g., 31) can be significantly increased. This overlay or flip-chip connection scheme also allows for a higher input/output (I/O) count as well as a more efficient placement of ground or return lines in the chip so as to assure high bandwidth performance and little disturbance without increasing the chip size. FIG. 3D of the drawings illustrates an example of a layout scheme of contact electrodes 34 of the connection carrier 33 and, correspondingly, a layout of the pads on the chip(s) and the assigned pads or landings on the board or MCM. Additionally, the vertical placement of the connection carrier or bump carrier allows for close spacing of the chips and the board. Use of known solder re-flow techniques allows for an even closer spacing of the chips and the board and with shorter interconnect pads between chips.

The connection carrier (e.g., bump carrier) includes wirings which electrically interconnect the semiconductor chip and the board (or MCM) through the electrical contacts (e.g., bump electrodes or, more particularly, solder bumps). The connection carrier can also be constituted by a substrate having at least one wiring layer and electrical components, including active and/or passive elements, including circuitry associated with operation of the semiconductor chip to which it is attached to. In fact, the circuitry on the connection carrier can itself be constituted as an integrated circuit and can have wirings in connection with effecting an electrical link between the semiconductor chip (which is affixed to the board) and the board. The connection carrier (e.g., bump carrier) can be made from material selected from the group consisting of silicon, sapphire ($Al_2O_3$), KAPTON, polytetrafluoroethylene (e.g., TEFLON), Ge and mixtures thereof. Also, the bump carrier can be effected using either polycrystalline or monocrystalline material. The bump carrier can also be constituted by a flexible film as a substrate, a thin film as a substrate or a thick film as a substrate. In fact, the bump carrier can be made by any well-known material in connection with effecting an electrical link, as noted above, and can have wirings only or both wirings and passive and/or active circuitry, furthermore, including buffer/controlling circuitry and the like associated with operation of the semiconductor chip(s) or die to which it is affixed. It is emphasized, the choices of materials with respect to the bump carrier, the board or MCM and the semiconductor chip are not to be construed as being limited to that mentioned in this specification. The choice of bump metal (e.g., InSn, PbSn, Au, etc.) is determined by the particular assembly requirements including temperature as well as reliability requirements.

Figure 3E:
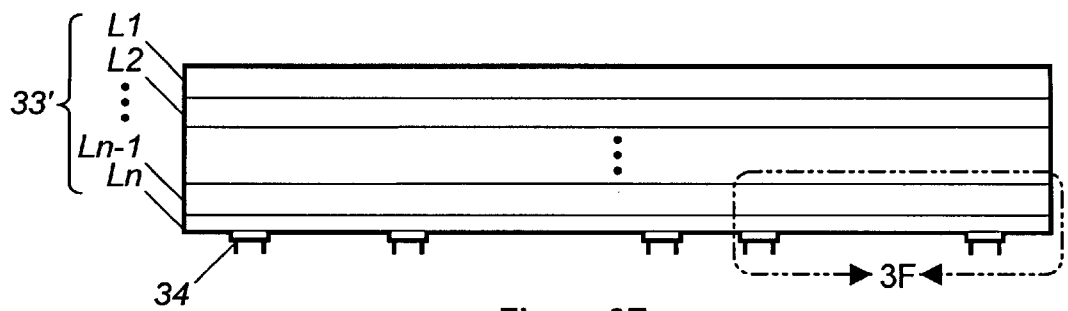
FIG. 3E is a schematic diagram of a side sectional view of another example of a connection carrier of the chip-to-board connection assembly, according to the present invention.
Figure 3F:
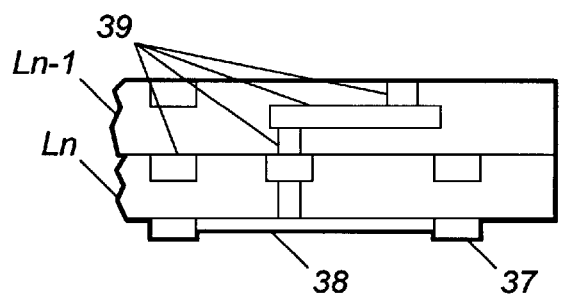
FIG. 3F is an exploded view typifying a portion 3F in FIG. 3E.
Figure 3G:
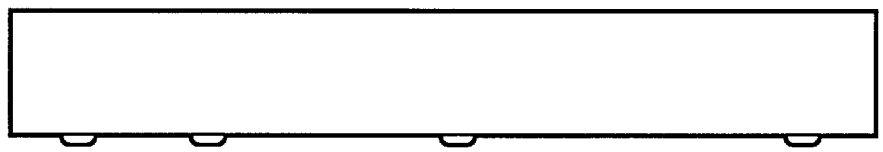
FIG. 3G is a schematic diagram of a side sectional view of a further example of a connection carrier of the chip-to-board connection assembly, according to the present invention.

FIG. 3E is illustrative of an example of a connection carrier 33' having a plurality of laminated wiring layers L1–Ln. FIG. 3F is an exploded view of a portion of FIG. 3E giving an example of individual wiring layers. In this example, 37 represents contact pads and 38 and 39 represent wirings. FIG. 3G exemplifies a connection carrier or bump carrier 33" in the form of a separate integrated circuit chip.

Figure 4A:
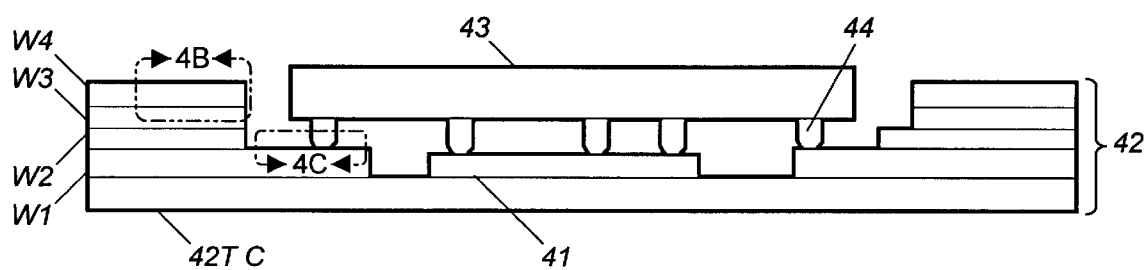
FIG. 4A is a schematic illustration of a side sectional view of a chip-to-board connection assembly according to a further embodiment of the present invention.
Figure 4B:
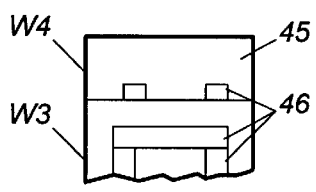
FIGS. 4B and 4C are exploded views of parts 4B and 4C of FIG. 4A, respectively.
Figure 4C:
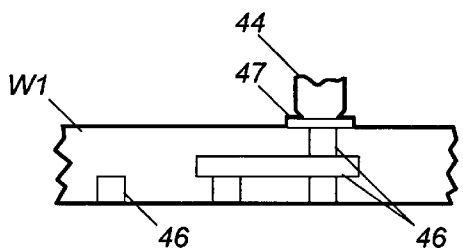

FIG. 4A shows a side sectional view of another chip-to-board connection assembly exemplifying the present invention and FIGS. 4B and 4C are examples of exploded views pertaining to details of individual wiring layers on the board or MCM 42. In this illustration, 41 represents a semiconductor chip or die, 42 is a board (e.g., MCM), 43 is the connection carrier (or bump carrier) and W1~W4 represent wiring layers that are disposed in any acceptable electrically insulating material. Reference 42TC is a base layer (or base plate) which is made of thermal conductive material (e.g., Al metal, Cu metal, Cu—W metal alloy, etc., and the like). The thermal conductive material, in effect, acts as a heat sink during operation of the IC chip/MCM. This example is illustrative of a scheme in which each sub-assembly of one or more semiconductor chips or die and corresponding bump carrier overlay are provided or retrofitted in the corresponding opening that is specifically assigned to that chip and carrier overlay sub-assembly. The dimensions of the semiconductor chip 41 as well as that of the bump carrier 43 determines the recessed opening for that sub-assembly. That is, the dimensions of both the semiconductor chip and bump carrier overlay are taken into account during the manufacture of the board or MCM. Care is taken in the design specification requirements and in the manufacture to maximize the coplanarity between the individual semiconductor chips that are mounted on the board or MCM and the bump lands on the MCM which are to be attached to the same bump carrier.

With regard the exploded views in FIGS. 4B and 4C, examples are shown of the different wiring layers and wirings therein in which 44 represents the electrode contact, for example, bump electrode, which is affixed to the pad or landing 47 of the MCM 42, 45 represents the electrical insulator or dielectric associated with the individual wiring layers and 46 represents examples of wirings. Also, the rear surface of the semiconductor chip or die 41 can be affixed to the thermal conductive layer 42TC by any well-known bonding process (e.g., epoxy, eutectic, solder, etc.). This bonding is illustrated in the embodiment of FIG. 5A of the drawings.

Figure 5A:
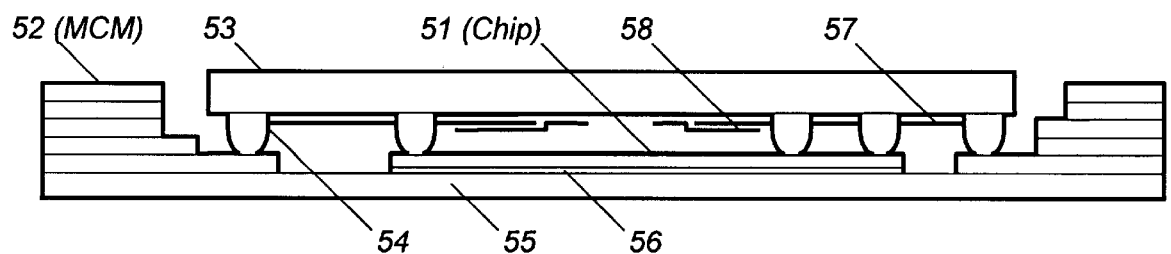
FIG. 5A is a schematic illustration of a side sectional view of a high-speed IC chip-bump carrier-MCM assembly.
Figure 5B:
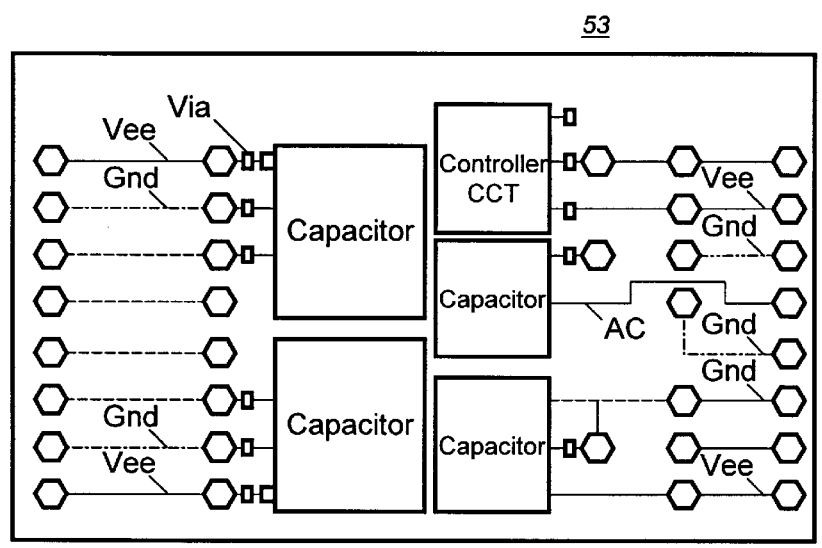
FIG. 5B is a schematic plan view of an example layout of various circuits/components, wirings and bump electrodes of the bump carrier shown in FIG. 5A.

FIG. 5A is a side sectional schematic of the invention as it relates to a high-speed IC chip-bump carrier-MCM assembly. FIG. 5B shows an example of a plan view layout of the various circuit elements/components, wirings and bump electrodes as it relates to the bump carrier in FIG. 5A. In this example, reference numeral 51 represents a high-speed IC chip or any high-performance chip, although not limited thereto. Reference 53 represents a bump carrier which is affixed to both the chip 51 and MCM 52 via bump electrodes 54 and the rear surface of the chip 51 is affixed, via bonding layer 56, to the inner plane surface of the back plate 55, which is a thermal conductor. 57 represents the control impedance lines which can be constituted by either metal or non-metal material including doped poly-Si, etc. Reference 58 shows an example of the capacitor that can be formed by either metal or non-metal material including doped poly-Si, etc. As noted from FIG. 5B, such capacitors would otherwise take up a large amount of area if formed on the chip 51 or, for that matter, formed separately on the surface of the MCM. Additionally, the bump carrier can be facilitated to also include control/buffer circuitry that would otherwise be included in the high-performance chip 51.

The provision of such a bump carrier overlay reduces considerably the complexity of the high-performance chip or, for that matter, any such semiconductor chip or die on the MCM in addition to overcoming problems of signal integrity that would typically be associated with bond wires and the like. Further, the bump carrier overcomes problems of thermal management that would otherwise be present, especially, if a highly complex semiconductor chip were to be connected as a flip-chip rather than allowing the chip to release the heat through the rear surface thereof to the MCM. The MCM can also have attached thereto or be facilitated to also include a heat sink which can be provided at the rear surface of the chip, e.g., by cutting a hole through the MCM.

Typically, the wirings (e.g., tracings) which are for electrically linking the semiconductor chip to the MCM are disposed on the bump carrier. Additionally, the discrete capacitors (e.g., power bypass capacitors and DC blocking capacitors), which otherwise would represent a significant yield risk to the ICs or which would be assembled onto the MCM, thereby adding significant costs and risks, would also be implemented on the bump carrier by well-known means. The circuit components/elements associated with the bump carrier can be those which have different signal frequency and/or power requirements than that of the semiconductor chip. For example, when the semiconductor chip is a high-performance chip (e.g., high or very high-power and/or high-speed chip), the bump carrier can be made to include those elements and/or components associated with the relatively lower frequency and/or power requirements.

In the case of Si or sapphire ($Al_2O_3$), entire CMOS circuits may be incorporated into the bump carrier that would be difficult or a nuisance to otherwise implement in the high-performance ICs. Therefore, bump carriers can be facilitated as "active bump carriers" when taking on active elements/components well suited to the bump carrier circuit technology thereby leaving the complement of the functionality to that of the high-performance chip for which it is best suited. Through such facilitating action, the high-performance chip can effectively be interconnected to the MCM or board through a single such bump carrier overlay whereby heat can be conducted through the rear surface of the high-performance chip. Such IC-bump carrier-MCM assembly can be schemed, for example, into the design of the signal translation board (STB) for the advanced technology support program (ATSP) crossbar switch. The HBT chips on the STB all incorporate a command buffer and controller which are used to manage the various level, amplitude and phase offsets in the signal paths of the chips. These functions are, typically, very low speed and power yet they account for up to two-thirds of the devices on these chips, thereby having a significant negative yield impact. However, by incorporating the control and command buffer functions into the bump carrier as CMOS structures, for example, HBT chip yield could more than double. This type of "active" bump carrier approach could be expected to result in a very high yield. Since this would eliminate bond wires and discrete capacitors, this translates into a very reasonable cost in addition to the benefits in improved performance that would be realized. Also, as 6- and 8-inch sapphire wafers, etc., become more common, thinned sapphire could be used to construct serviceable micro strip and stripline cables. Extending the concept and teachings of the connection carrier or bump carrier described in this specification, active electronics can be integrated into the cable (e.g., CMOS, etc.) and ICs may also be bumped onto the same cable. Thin film processing would be employed since it yields the highest possible trace (wirings) density and, moreover, conductive thickness control is also superior to that of, for example, a plating process which is typical in high density cable fabrication.

The choice of sapphire for the connection carrier (e.g., bump carrier substrate) is a good one, for example, for GaAs ICs on a ceramic MCM since all of the coefficients of thermal expansion are approximately within one ppm/° C. of one another. Sapphire ($Al_2O_3$) is also a good choice since, like KAPTON and TEFLON, it is somewhat flexible when thinned. The level of flexibility implemented is a matter of the intended use of the assembly. Flexibility may be a very useful property, for example, in a bump carrier for various reasons including thermal expansion tolerance and coplanar offset mechanical relief. In fact, bump carriers of Si and sapphire, for example, can be fabricated in commercial Si IC facilities which, for example, are producing CMOS/SOS. This allows use of all layers of a commercial CMOS process, allowing passive components like resistors and capacitors to be added to the bump carrier, and even allowing the bump carrier to have active circuitry on it, e.g., CMOS and the like. Bump carriers using other materials like KAPTON can be fabricated, for example, by readily available commercial means being used for flex cable. KAPTON is especially feasible for wirings. The application of electrical contacts, for example, solder bumps, on bump carriers can be readily effected through any number of known commercially available processes, also. The choice of bump metal, as noted earlier, is determined by the particular assembly requirements including temperature as well as reliability requirements.

Rework is also feasible and even easy. When rework is called for, the assembly is mounted on an appropriate carrier and is heated to the particular phase change temperature of the solder bumps and the bump carrier can be easily pulled off without damaging bump lands on the board. The other bump carriers can remain in place as their surface tension will hold them in place. Obviously, care is taken not to disturb these. Refurbishing the bump landing area is also well understood by those skilled in this area of technology and can be practically effected by known techniques. If the rework calls for replacement of the semiconductor chip, the bump carrier is first removed in the same way, the semiconductor chip is removed from the well by, for example, prying it out and cleaning off any bonding residue and a new semiconductor chip is subsequently affixed onto the MCM. The bump carrier (with refurbished bumps) is then flipped back onto both the new semiconductor chip and the MCM. Care is taken to keep all heating local and if the adjacent chips do heat up, surface tension keeps the bump carriers in place, nonetheless.

Figure 6:
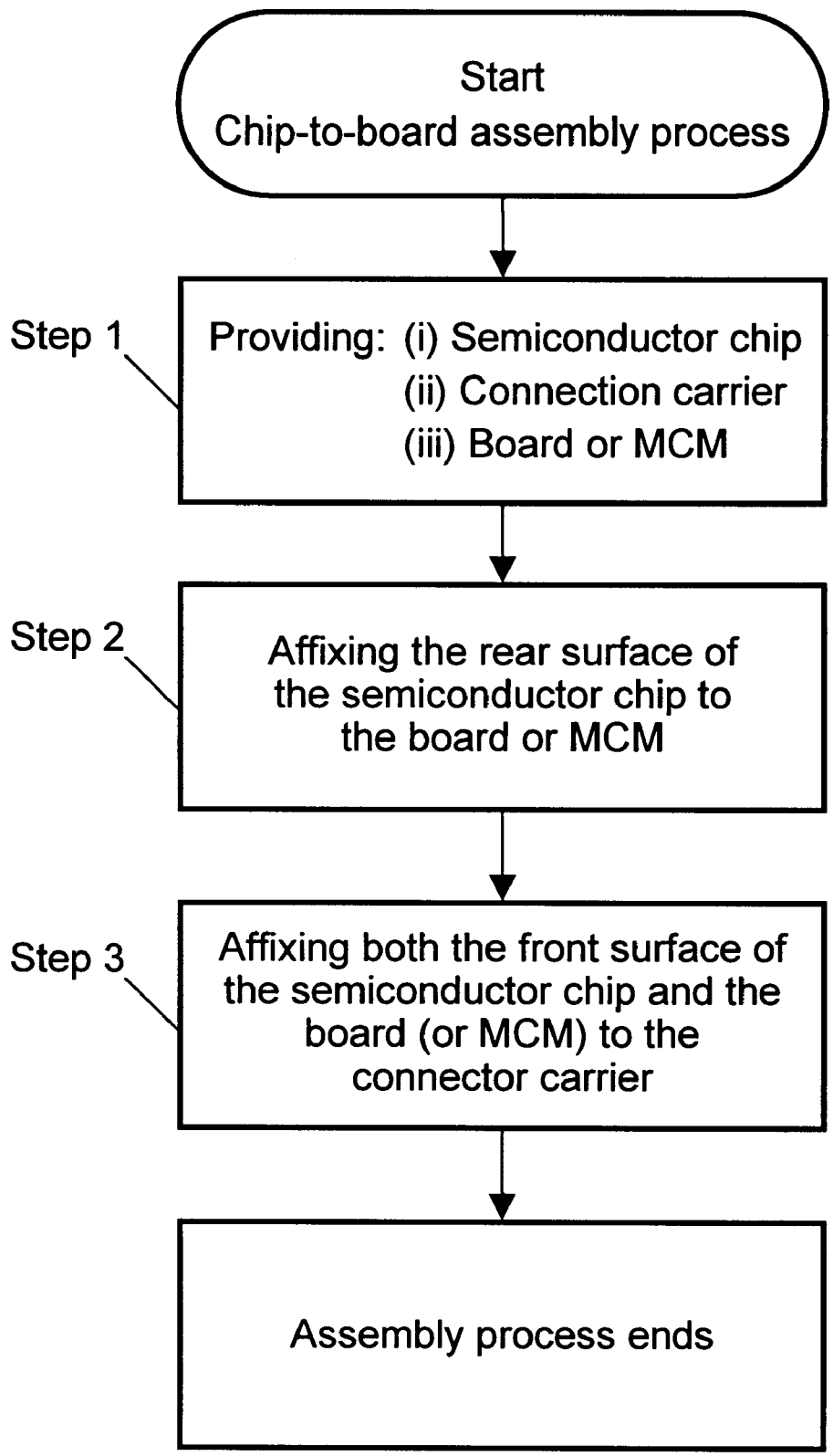
FIG. 6 is a flowchart of one method of producing the chip-to-board connection assembly according to the present invention.
Figure 7:
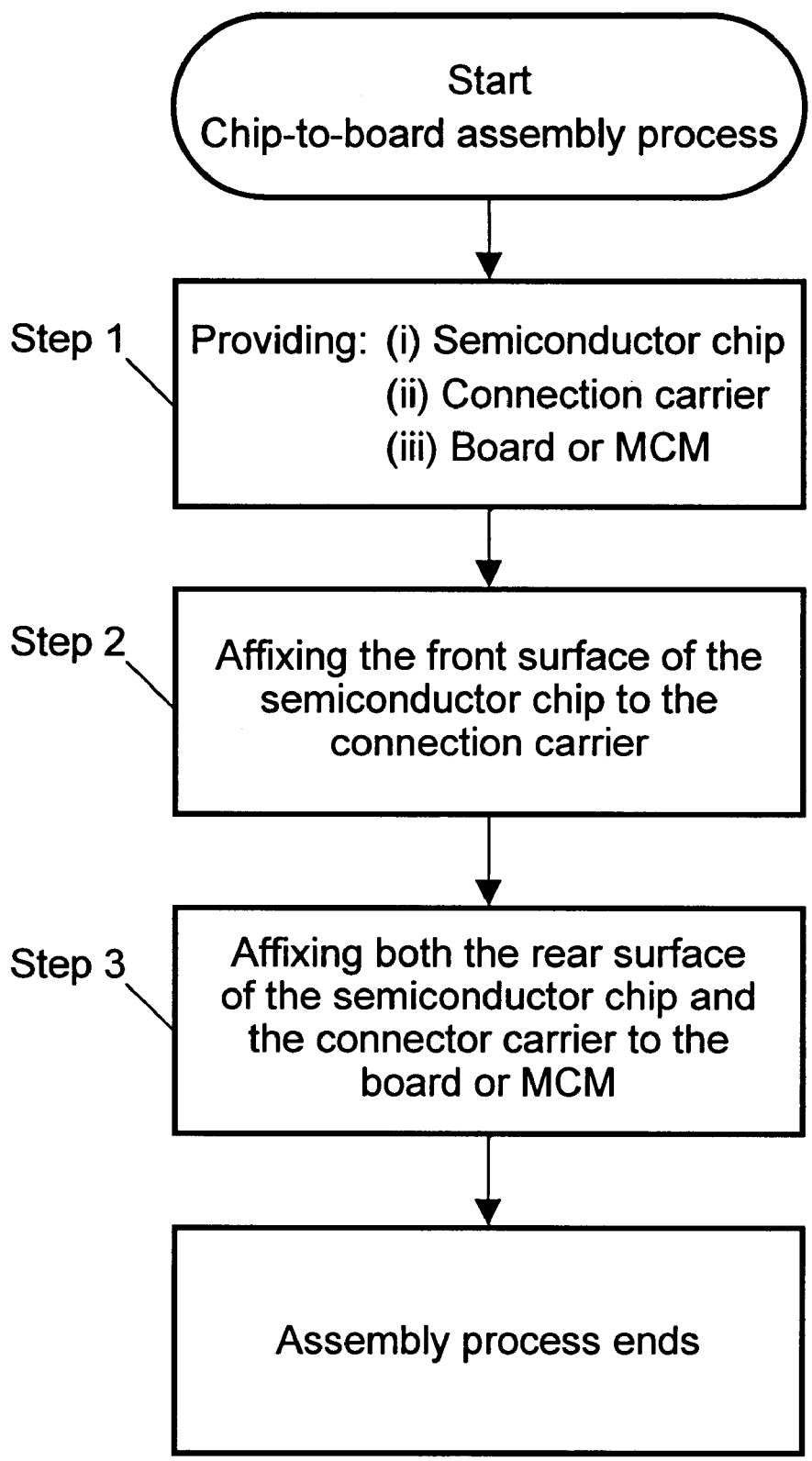
FIG. 7 is a flowchart of another method of producing the chip-to-board connection assembly according to the present invention.

FIGS. 6 and 7 illustrate flowcharts in connection with the showing of two applicable methods for effecting the chip-to-board assembly. Both methods are equally applicable and the method chosen would depend on the processes available and level of skill of the manufacturer. A description will be given with regard to the flowchart in FIG. 6 followed by a description of the flowchart in FIG. 7.

In both schemes, the semiconductor chip, the connection carrier and the board (mounting board of MCM) are separately provided by the manufacturer with pre-set specifications through available known fabrication schemes (step 1). The connection carrier (e.g., bump carrier) is specifically designed to effect an electrical link between the board (or MCM) and the semiconductor chip which chip may be either a high-performance chip or, for that matter, any specified device (e.g., chip or die). The semiconductor chip is provided with a first principal surface (or front surface) on which external pads are provided, the connection carrier has a surface at a first side thereof on which electrical contacts are provided and the board is provided with (a) contact pads or landings in an alignment conforming to the position of the electrical contacts when the connection carrier becomes attached and with (b) recessed openings. It is also clearly understood that the dimensions of both the semiconductor chip and corresponding connection carrier determine the mounting board or MCM openings (e.g., recessed openings), as earlier described.

In accordance with this first method, the second principal surface (or rear surface) of the semiconductor chip is affixed first to an inner surface in a recess opening at a first surface side of the board (step 2). Subsequently, the connection carrier is affixed to both the first principal surface (or front surface) of the chip and the board in a manner which electrically links the semiconductor chip and the board (step 3). In accordance with this method, the electrical contacts (e.g., solder bumps) are used to affix the first side of the connection carrier to both the principal surface of the semiconductor chip and the board in a manner in which each such electrical contact effects an interconnection between the contact location (e.g., contact pad) at the first side of the connection carrier facing the semiconductor chip and an oppositely disposed (i) external pad on the chip or (ii) contact pad or landing at a side of the board facing the connection carrier. A cover or encapsulation may or may not be required once this assembly process is completed.

According to the alternative scheme, illustrated in FIG. 7 of the drawings, rather than first affixing the rear surface of the semiconductor chip to the MCM, the first principal surface (or front surface) of the semiconductor chip is instead affixed to the first surface side of the connection carrier (the first surface side of the connection carrier being provided with the electrical contacts [e.g., solder bumps]) (step 2). Upon completion of step 2, both the second principal surface (or rear surface) of the semiconductor chip and the connection carrier are affixed to the board (mounting board or MCM) in a manner which electrically links the chip and the board. It should be noted, this step 3 is inclusive of a step of affixing the rear surface of the semiconductor chip to an inner (contact) surface in a recessed opening of the board, via well-known bonding schemes (including those discussed earlier), as well as the process of affixing the carrier to the board. This second method also uses the electrical contacts (e.g., solder bumps) that are provided on the first surface side of the connection carrier to affix the front surface of the chip to the connection carrier (see step 2) and, subsequently, to affix the connection carrier to the board (or MCM) (see step 3).

Using standard solder re-flow techniques, for example, the second method allows surface tension to maximize registration between the bump carrier overlay and the chip. One can then perform a second alignment and re-flow to mount the bump carrier overlay/chip assembly onto the mounting board or MCM. In both methods, epoxy bonding or any well-known affixing scheme that would assure good thermal contact between the rear surface of the chip and the MCM thermal conductor is acceptable. To assure risk-free good bump connections or avoid some unforeseen damage to the components during the attaching process, metallurgy must be compatible for strong welds between that of the pads on the semiconductor chip and the solder filler and the latter with the overlay metallization associated with the bump carrier.

In providing an IC-bump carrier-MCM assembly, for example, care must be taken in the design specification requirements and in the manufacture in step 1 so as to maximize the coplanarity between the individual semiconductor chip pads once the chips are mounted on the board or MCM and the bump lands on the MCM which are to be attached to the same bump carrier. Care must also be taken to assure alignment of the bump carrier pads to both the chip pads and the MCM pads or landings. A coplanarity which has an offset of $<\pm 10$ $\mu$m, which is easily attainable by known automated pick-and-place equipment, is well within an acceptable range. Likewise, alignment of the bump carrier pads to both the semiconductor chip pads and the MCM pads or landings, having an offset of $<\pm 12$ $\mu$m, which is also readily attainable by such automated pick-and-place equipment, is considered satisfactory. Although FIGS. 6 and 7 are described in connection with a single semiconductor chip/connection carrier assembly, it is understood, however, both methods are equally applicable to a plurality of such assemblies, i.e. plural sub-assemblies on the board (or MCM).

Figure 8:
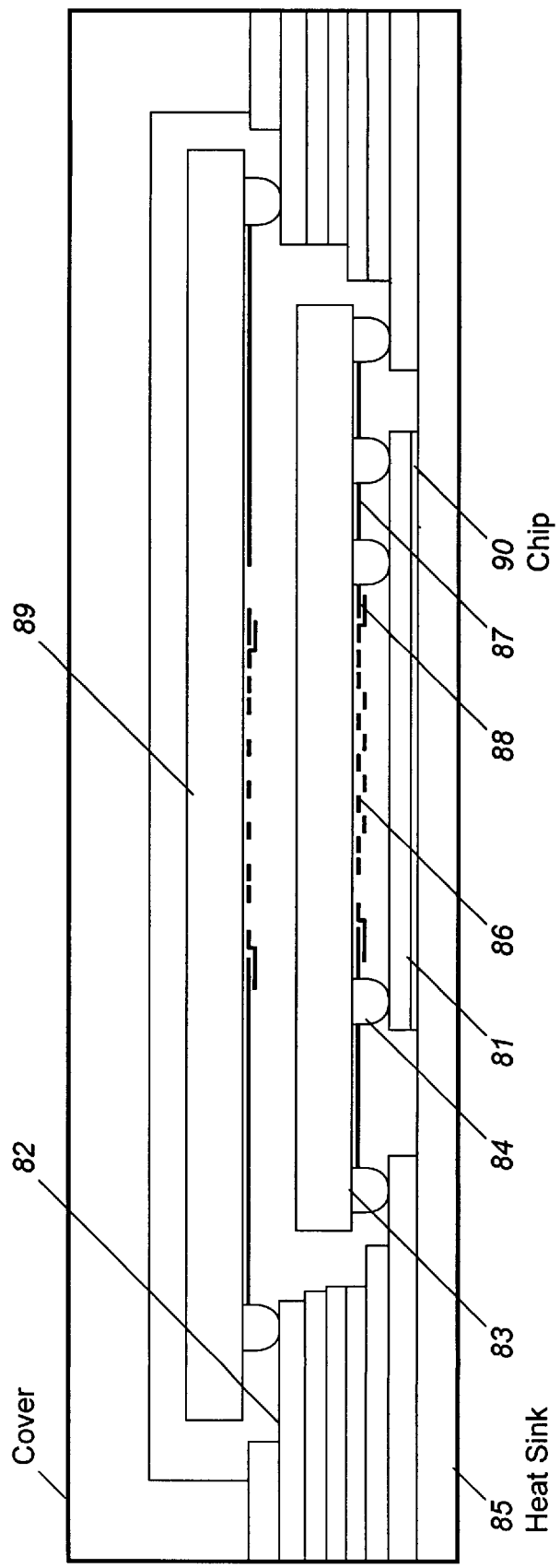
FIG. 8 is a schematic illustration of a side sectional view according to a still further embodiment of the present invention showing greater vertical integration.

It is also possible to vertically assemble an arbitrary number of monolithic components (e.g., a plural vertical arrangement of bump carriers disposed as a multi-level carrier overlay above a chip or die and together are affixed to a board [MCM]) with the proviso that only the bottom component can have an adequate thermal path; the bottom component can typically be a high-performance semiconductor chip or die or, for that matter, any semiconductor device (e.g., chip or die). An example of this is the vertical flip-chip connection assembly shown in FIG. 8 of the drawings, where a MEMS device 86 which is provided on the sapphire overlay 83, is sandwiched between a high-speed chip, such as HBT device 81, and a controller 89 (e.g., CMOS controller), the controller having lower speed/power requirements than that of the HBT. The HBT 81 is affixed to the heat conductor/heat sink 85 via bonding layer 90 (e.g., epoxy, eutectic, etc.) and the CMOS controller 89 is an additional connection carrier overlay to handle both the MEMS (microelectromechanical sensors) device and the HBT device. Also in FIG. 8, reference 82 refers to the MCM, reference 84 refers to the bump electrodes, 87 refers to the wire tracings on the sapphire 83, and 88 refers to integrated capacitors (e.g., poly-Si capacitors). It should be noted, the embodiment in FIG. 8 is being provided as an example only of a showing of implementing the invention where an arbitrary number of monolithic components can be vertically arranged to effect a multi-level carrier overlay. Other components and different connection carrier overlay assemblies are applicable, also.

Figure 9A:
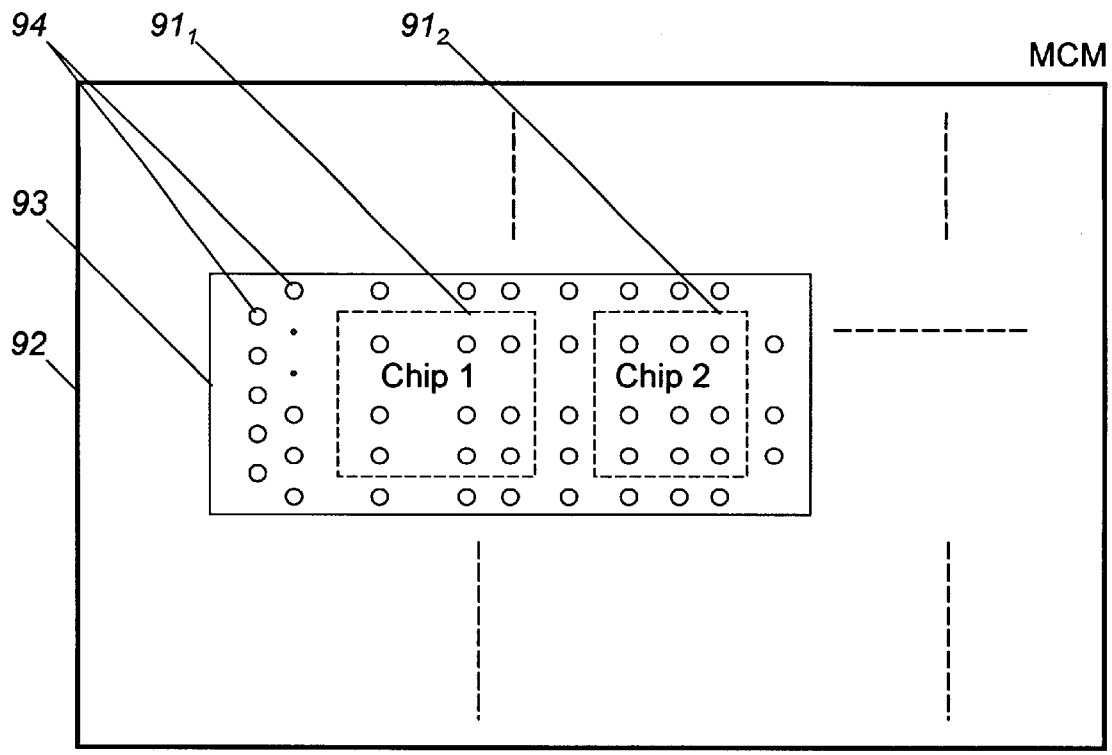
Figure 9B:
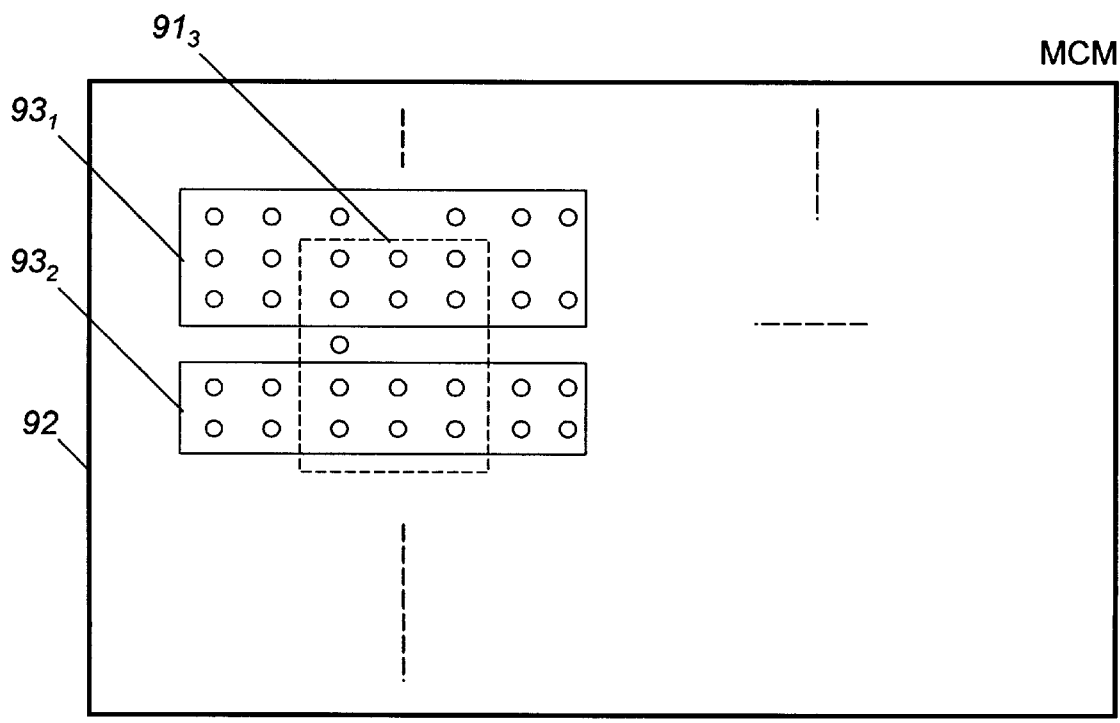

The present invention is not necessarily limited to an assembly in which a single bump carrier is used as an overlay for interconnecting the semiconductor chip to its MCM. In fact, several bump carriers may be required to interconnect a single IC to the MCM or, alternatively, a single bump carrier may be used to interconnect several semiconductor chips to the MCM or board. An example of these are shown in FIGS. 9A and 9B, where references 91$_1$, 91$_2$, 91$_3$ relate to a semiconductor chip or die, reference 92 relates to an MCM, references 93, 93$_1$ and 93$_2$ relate to connection carrier overlays and 94 relates to electrical contacts (e.g., bump electrodes, etc.) and, correspondingly, to the layout of the pads on the chips and the assigned pads or landings on the MCM.

The disclosed invention is not only directed to MCM assemblies including high-speed IC/MCMs and chip-on-board assemblies per se, but it also has commercial application in a number of other technology areas. Although not limited thereto, the disclosed invention is applicable to cellular telephone hand sets and mobile sets, personal digital communication sets, receivers, analog-to-digital converters (ADCs) with, for example, an HBT front end and extensive CMOS circuitry on the back end which could save on power costs with very little or no performance compromise. Such commercial applications as well as others (e.g., photonics, etc.) can benefit through using bump carrier technology to combine the most optimum components in their respective optimum technologies including GaAs HBT and the like, CMOS/SOS and MEMS, etc.

It is submitted, the present description as it relates to the accompanying exemplified embodiments is merely illustrative and that various modifications thereof as well as alternative arrangements are possible according to the present invention. That is, the present invention is not limited to the embodiments/examples described in this specification and illustrated in the accompanying drawings but, rather, the invention covers various other and obvious modifications thereof as well as different embodiments that fall within the scope of the appended claims.

We claim:

1. A chip-to-board connection assembly, comprising:

a semiconductor chip having a first principal surface on which external terminal pads are provided;

a board having a recessed opening with an inner surface to which a second, opposing principal surface of said semiconductor chip is affixed; and a connection carrier which electrically links said semiconductor chip and said board, wherein said connection carrier is affixed to both said semiconductor chip and said board via electrical contacts, each electrical contact effecting an interconnection between a contact location provided at a side of said connection carrier facing said semiconductor chip and an oppositely disposed one of (i) external pad on the chip and (ii) external landing at a side of said board facing said connection carrier, the side of said board facing said connection carrier has said recessed opening.

2. A chip-to-board connection assembly according to claim 1, wherein heat generated during operation of said semiconductor chip is dissipated via a side of said second principal surface of the chip.

3. A chip-to-board connection assembly according to claim 1, wherein said connection carrier includes wirings which electrically interconnect said semiconductor chip and said board, through said electrical contacts.

4. A chip-to-board connection assembly according to claim 1, wherein said connection carrier includes a substrate having wirings which electrically interconnect said semiconductor chip and said board, through said electrical contacts, and having electrical components inclusive of circuitry associated with operation of said semiconductor chip.

5. A chip-to-board connection assembly according to claim 4, wherein said electrical components include at least one of a power bypass capacitor and coupling capacitor.

6. A chip-to-board connection assembly according to claim 1, wherein said board includes at least one wiring layer, and wherein the recessed opening of said board has a depth extending to an inner plane surface of a base layer thereof, said recessed opening being dimensioned so as to retrofit thereat said semiconductor chip, the rear surface of which is to be affixed to said inner plane surface, and said connection carrier.

7. A chip-to-board connection assembly, comprising:

a semiconductor chip having a first, front surface on which external terminal pads are provided;

a board having a recessed opening with an inner surface to which a second, rear surface of said semiconductor chip is affixed; and a bump carrier which electrically links said semiconductor chip and said board, wherein said bump carrier is affixed to both said semiconductor chip and said board via bump electrodes, each bump electrode effecting an interconnection between a contact location provided at a side of said bump carrier facing said semiconductor chip and an oppositely disposed one of (i) external pad on the chip and (ii) external landing at a side of said board facing said bump carrier, the side of said board facing said bump carrier has said recessed opening.

8. A chip-to-board connection assembly according to claim 7, wherein said board includes a portion on which wirings are provided and another portion, acting as a heat sink, on which said semiconductor chip is affixed.

9. A chip-to-board connection assembly according to claim 7, wherein said bump carrier includes wirings which electrically interconnect said semiconductor chip and said board, through said bump electrodes.

10. A chip-to-board connection assembly according to claim 7, wherein said bump carrier is constituted by a separate substrate having at least one wiring layer and electric components, including at least one of active and passive elements, associated with operation of said semiconductor chip.

11. A chip-to-board connection assembly according to claim 7, wherein said bump carrier is made from a material selected from the group consisting of Si, Sapphire ($Al_2O_3$), polytetrafluoroethylene, Ge and mixtures thereof.

12. A chip-to-board connection assembly according to claim 7, wherein said bump carrier has a crystalline structure which is one of polycrystalline and monocrystalline.

13. A chip-to-board connection assembly according to claim 7, wherein said bump carrier includes an integrated circuit chip.

14. A chip-to-board connection assembly according to claim 7, wherein said bump carrier at least one of different signal frequency and power requirements than that of said semiconductor chip.

15. A chip-to-board connection assembly according to claim 7, wherein said bump carrier includes a flexible film as a substrate.

16. A chip-to-board connection assembly according to claim 7, wherein said bump carrier includes a thin film as a substrate.

17. A chip-to-board connection assembly according to claim 7, wherein said bump carrier includes a thick film as a substrate.

18. A chip-to-board connection assembly, comprising:
at least one semiconductor chip each of which has a first, front surface on which external terminal pads are provided;
a board to which each said semiconductor chip is affixed, wherein said board has a recessed opening with an inner surface to which a second, rear surface of one or more of said at least one semiconductor chip is affixed; and
at least one bump carrier which electrically links one or more of said at least one semiconductor chip in said recessed opening to said board,
wherein said bump carrier is disposed as a flip-chip connector, affixed to both said one or more of said at least one semiconductor chip and said board via bump electrodes, each bump electrode providing an interconnection between a contact location provided at a side of said bump carrier facing a semiconductor chip provided in said recessed opening and a corresponding oppositely disposed one of (i) external pad on the chip and (ii) external landing at a side of said board facing said bump carrier, the side of said board facing said bump carrier has said recessed opening.

19. A chip-to-board connection assembly according to claim 18, wherein said bump carrier includes a separate substrate having at least one wiring layer which provides for electrical communication at least one of (i) between one or more semiconductor chips and said board and (ii) between different semiconductor ships on said board.

20. A chip-to-board connection assembly according to claim 18,
wherein said said board is a multichip module having at least one layer of wirings and a base layer, and
wherein said multichip module has recessed openings of a depth extending to an inner plane surface of said base layer thereof, each recessed opening being dimensioned so as to retrofit thereat a designated sub-assembly including one or more of said at least one semiconductor chip, the rear surface thereof to be affixed to said inner plane surface, and a corresponding one or more of said bump carrier to be in flip-chip connection therewith and with said module.

21. A vertical flip-chip connection assembly, comprising:
at least one semiconductor chip having a first, front surface on which external terminal pads are provided;
a board having a surface at a first side thereof to which a second, rear surface of each said semiconductor chip is affixed; and
at least one multi-level carrier overlay each of which (i) electrically links one or more of said at least one semiconductor chip and said board, and (ii) electrically links one part of said board with another part thereof,
wherein each said multi-level carrier overlay includes a plurality of connection carriers disposed in a vertical arrangement at the first side of said board,
wherein at least one connection carrier of said multi-level carrier overlay is in electrical contact with one or more of said at least one semiconductor chip,
wherein a first-level connection carrier of said multi-level carrier overlay is affixed to both said one or more of said semiconductor chip and said board via electrical contacts, each electrical contact effecting an interconnection between a contact location provided at a side of said first-level connection carrier facing a respective chip and an oppositely disposed one of (i) external pad on that chip and (ii) external landing at a side of said board facing said first-level connection carrier, and
wherein another, higher-level connection carrier of said multi-level carrier overlay, which overlies both said semiconductor chip and said first-level connection carrier, is at least affixed to different parts of said board via electrical contacts.

22. A vertical flip-chip connection assembly according to claim 21,
wherein the vertically arranged said plurality of connection carriers are bump carriers disposed as flip-chip connectors, respectively, and
wherein said electrical contacts consist of bump electrodes.

23. A vertical flip-chip connection assembly according to claim 21, wherein heat generated during operation of the assembly is dissipated via the rear surface of said semiconductor chip.

24. A vertical flip-chip connection assembly to claim 21, wherein said board is a multichip module including at least one wiring layer and a base layer, said multichip module having at least one recessed opening each extending to an inner surface of said base layer thereof and each dimensioned so as to provide thereat a sub-assembly including said one or more of said at least one semiconductor chip and a corresponding said multi-level carrier overlay.

25. A method of providing a chip-to-board connection assembly, comprising the steps of:
(a) providing separately (i) a semiconductor chip, (ii) a connection carrier and (iii) a board,
wherein said semiconductor chip has a first principal surface on which external terminal pads are provided, said connection carrier has a surface at a first side thereof on which electrical contacts are provided and said board has contact pads or landings and has a recessed opening dimensioned to retrofit thereat at least said semiconductor chip;
(b) affixing a second, opposing principal surface of said semiconductor chip to an inner surface in said recessed opening of said board; and
(c) affixing said connection carrier to both the first principal surface of said semiconductor chip and said board in a manner which electrically links said semiconductor chip and said board,
wherein said electrical contacts are used to affix the first side of said connection carrier to both the principal surface of said semiconductor chip and said board, each electrical contact effecting an interconnection between a contact location at the first side of said connection carrier facing said semiconductor chip and an oppositely disposed one of (i) external pad on the chip and (ii) landing at a side of said board facing said connection carrier, the side of said board facing said connection carrier has said recessed opening.

26. A method according to claim 25, wherein said step of providing said board includes providing said board with wirings and with a portion acting as a heat sink of heat generated during operation of said semiconductor chip, in the assembly, the inner surface in said recessed opening including a contact surface of the heat sink portion through which the generated heat is to be released.

27. A method according to claim 25, wherein said step (a) includes providing said connection carrier with wirings which are for electrically interconnecting said semiconductor chip and said board, in the assembly, through said electrical contacts.

28. A method according to claim 25, wherein said step (a) includes providing said connection carrier to include a substrate with wirings which are for electrically interconnecting said semiconductor chip and said board, through said electrical contacts, and with electrical components inclusive of circuitry associated with operation of said semiconductor chip, in the assembly.

29. A method of providing a chip-to-board connection assembly, comprising the steps of:
(a) providing separately (i) a semiconductor chip, (ii) a bump carrier and (iii) a board,
wherein said semiconductor chip has a first, front surface on which external terminal pads are provided, said bump carrier has a surface at a first side thereof on which bump electrodes are provided and said board has landings and has a recessed opening dimensioned to retrofit thereat at least said semiconductor chip;
(b) affixing a second, rear surface of said semiconductor chip to an inner surface in said recessed opening of said board; and
(c) disposing said bump carrier over both the front surface of said semiconductor chip and said board in a manner which electrically links said semiconductor chip and said board,
wherein step (c) includes providing bump electrodes which are used to affix the first side of said bump carrier to both the front surface of said semiconductor chip and said board, each bump electrode effecting an interconnection between a contact location at the first side of said bump carrier facing said semiconductor chip and an oppositely disposed one of (i) external pad on the chip and (ii) landing at a side of said board facing said bump carrier, the side of said board facing said bump carrier has said recessed opening.

30. A method according to claim 29, wherein said step of providing said bump carrier includes providing said bump carrier with wirings which are for electrically interconnecting said semiconductor chip and said board, in the assembly, through said bump electrodes.

31. A method according to claim 29, wherein said step of providing said bump carrier includes providing said bump carrier to include a substrate with at least one wiring layer and electrical components associated with operation of said semiconductor chip, in the assembly.

32. A method according to claim 29, wherein step of providing said bump carrier includes providing said bump carrier made from a material selected from the group consisting of Si, Sapphire ($Al_2O_3$), polytetrafluoroethylene, Ge and mixtures thereof.

33. A method according to claim 29, wherein said step of providing said bump carrier includes providing said bump carrier made from material having a crystalline structure which is either polycrystalline or monocrystalline.

34. A method according to claim 29, wherein said step of providing said bump carrier includes providing an integrated circuit chip as a bump carrier overlay.

35. A method according to claim 29, wherein said step of providing said bump carrier includes providing said bump carrier so as to have different signal frequency and/or power requirements than that of said semiconductor chip.

36. A method according to claim 29, wherein said step of providing said bump carrier includes providing said bump carrier in the form of a flexible film substrate.

37. A method according to claim 29, wherein said step of providing said bump carrier includes providing said bump carrier in the form of a thin film substrate.

38. A method according to claim 29, wherein said step of providing said bump carrier includes providing said bump carrier in the form of a thick film substrate.

39. A method of providing a chip-to-board connection assembly, comprising the steps of:
(a) providing separately (i) at least one semiconductor chip, (ii) at least one bump carrier and (iii) a board,
wherein each semiconductor chip has a first, front surface on which external terminal pads are provided, each bump carrier has a surface at a first side thereof on which bump electrodes are provided and said board has landings and has a recessed opening dimensioned to retrofit thereat one or more of said at least one semiconductor chip;
(b) affixing a second, rear surface of each said semiconductor chip to said board such that said one or more of said at least one semiconductor chip is affixed to an inner surface in said recessed opening; and
(c) disposing said bump carrier as a flip-chip connector over both the front surface of one or more of said at least one semiconductor chip in said recessed opening and said board in a manner which electrically links said one or more of said at least one semiconductor chip and said board,
wherein said bump electrodes are used to affix the first side of said bump carrier to both the front surface of said one or more of said semiconductor chip and said board, each bump electrode effecting an interconnection between a contact location at the first side of said bump carrier facing a respective chip provided in said recessed opening and an oppositely disposed one of (i) external pad on that chip and (ii) landing at a side of said board facing said bump carrier, the side of said board facing said bump carrier has said recessed opening.

40. A method according to claim 39, wherein said step of providing said at least one bump carrier includes providing each bump carrier to include a substrate with at least one wiring layer which provides for electrical communication at least one of (i) between one or more semiconductor chips and said board and (ii) between different semiconductor chips on said board, in the assembly.

41. A method according to claim 39, wherein said step of providing said board includes providing said board as a multichip module having one or more layers of wirings and a base layer, and having recessed openings of a depth extending to an inner plane surface of said base layer thereof, each recessed opening being dimensioned so as to retrofit thereat a designated sub-assembly including one or more of said at least one semiconductor chip, the rear surface thereof to be affixed to said inner plane surface, and a corresponding one or more of said bump carrier to be in flip-chip connection therewith and with said module.

42. A method of providing a vertical flip-chip connection assembly, comprising the steps of:
   (a) providing separately (i) at least one semiconductor chip, (ii) a plurality of connection carriers and (iii) a board,
      wherein each semiconductor chip has a first, front surface on which external terminal pads are provided, each bump carrier has a surface at a first side thereof on which electrical contacts are provided and said board has landings;
   (b) affixing a second, rear surface of each said semiconductor chip to said board; and
   (c) disposing a multi-level carrier overlay over both the front surface of one or more of said at least one semiconductor chip and said board in a manner which (i) electrically links said one or more of said at least one semiconductor chip and said board and (ii) electrically links one part of said board with another part thereof, said multi-level carrier overlay including a plurality of connection carriers disposed in a vertical arrangement at a first side of said board,
      wherein at least one connection carrier of said multi-level carrier overlay is in electrical contact with one or more of said at least one semiconductor chip,
      wherein a first-level connection carrier of said multi-level carrier overlay is affixed to said one or more of said at least one semiconductor chip and to said board via said electrical contacts, each electrical contact effecting an interconnection between a contact location provided at a side of said first-level connection carrier facing a respective chip and an oppositely disposed one of (i) external pad on that chip and (ii) external landing at a side of said board facing said first-level connection carrier, and
      wherein another, higher-level connection carrier of said multi-level carrier overlay, which overlies both said semiconductor chip and said first-level connection carrier, is at least affixed to different parts of said board via electrical contacts.

43. A method according to claim 42, wherein said step of providing said connection carriers includes providing said connection carriers as bump carriers and said electrical contacts as bump electrodes.

44. A method according to claim 42, wherein said step of providing said board includes providing said board as a multichip module having at least one wiring layer and a base layer, and having at least one recessed opening each extending to an inner surface of said base layer thereof and each dimensioned so as to provide thereat a sub-assembly including said one or more of said semiconductor chip and a corresponding said multi-level carrier overlay.

45. A method according to claim 42, wherein said step of providing said connection carriers includes providing each connection carrier to include a substrate having at least one wiring layer.

46. A method according to claim 42, wherein said step of providing said board includes providing said board with wirings and with a portion acting as a heat sink of heat generated during operation of said semiconductor chip, in the assembly, the heat sink portion having an inner contact surface at a recessed opening at the first side of said board to which the rear surface of said one or more of said semiconductor chip is to be affixed.

47. A method of providing a chip-to-board connection assembly, comprising the steps of:
   (a) providing separately (i) a semiconductor chip, (ii) a connection carrier and (iii) a board,
      wherein said semiconductor chip has a first principal surface on which external terminals are provided, said connection carrier has a surface at a first side thereof on which electrical contacts are provided and said board has landings and has a recessed opening dimensioned to retrofit thereat at least said semiconductor chip;
   (b) affixing said first principal surface of said semiconductor chip to the first surface side of said connection carrier; and
   (c) affixing both a second, opposing principal surface of said semiconductor chip and said connection carrier to said board in a manner which electrically links said semiconductor chip and said board,
      wherein the second principal surface of said semiconductor chip is affixed to an inner surface in said recessed opening of said board, and
      wherein said electrical contacts, provided on the first surface side of said connection carrier, are used to affix the first principal surface of said semiconductor chip to said connection carrier, in step (b), and affix said connection carrier to said board, in step (c), each electrical contact effecting an interconnection between a contact location at the first side of said connection carrier facing said semiconductor chip and an oppositely disposed one of (i) external pad on the chip and (ii) landing at a side of said board facing said connection carrier, the side of said board facing said connection carrier has said recessed opening.

48. A method of providing a chip-to-board connection assembly, comprising the steps of:
   (a) providing separately (i) a semiconductor chip, (ii) a bump carrier and (iii) a board,
      wherein said semiconductor chip has a first, front surface on which external terminal pads are provided, said bump carrier has a surface at a first side thereof on which bump electrodes are provided and said board has contact pads or landings and has a recessed opening dimensioned to retrofit thereat at least said semiconductor chip;
   (b) affixing said first, front surface of said semiconductor chip to the first surface side of said bump carrier; and (c) affixing both a second, rear surface of said semiconductor chip and said bump carrier to said board in a manner which electrically links said semiconductor chip and said board,
wherein the rear surface of said semiconductor chip is affixed to an inner surface in said recessed opening of said board, and
wherein said bump electrodes, provided on the first surface side of said bump carrier, are used to affix the first front surface of said semiconductor chip to said bump carrier, in step (b), and affix said bump carrier to said board, in step (c), each bump electrode effecting an interconnection between a contact location at the first side of said bump carrier facing said semiconductor chip and an oppositely disposed one of (i) external pad on the chip and (ii) landing at a side of said board facing said bump carrier, the side of said board facing said bump carrier has said recessed opening.

49. A method of providing a chip-to-board connection assembly, comprising the steps of:
(a) providing separately (i) at least one semiconductor chip, (ii) at least one bump carrier and (iii) a board,
wherein each semiconductor chip has a first, front surface on which external terminal pads are provided, each bump carrier has a surface at a first side thereof on which bump electrodes are provided and said board has contact pads or landings and has a recessed opening dimensioned to retrofit thereat one or more of said at least one semiconductor chip;
(b) affixing said first, front surface of said semiconductor chip to the first surface side of one or more of said bump carrier; and
(c) disposing said bump carrier as a flip-chip connector over both the front surface of one or more of said semiconductor chip and said board in a manner which electrically links the said one or more of said at least one semiconductor chip and said board,
wherein, in step (b), the bump electrodes are used to affix the first principal surface of said semiconductor chip to said one or more of said bump carrier, and, in step (c), the rear surface of said one or more of said semiconductor chip is affixed to an inner surface in said recessed opening of said board and said bump carrier is affixed to said board, each bump electrode effecting an interconnection between a contact location at the first side of said bump carrier facing a respective chip and an oppositely disposed one of (i) external pad on that chip and (ii) landing at a side of said board facing said bump carrier.

50. A method of providing a vertical flip-chip connection assembly, comprising the steps of:
(a) providing separately (i) at least one semiconductor chip, (ii) a plurality of connection carriers and (iii) a board,
wherein each semiconductor chip has a first, front surface on which external terminal pads are provided, each connection carrier has a surface at a first side thereof on which electrical contacts are provided and said board has contact pads or landings;
(b) affixing said first, front surface of each said semiconductor chip to the first surface side of one or more of said connection carriers; and
(c) disposing a multi-level carrier overlay, which includes a plurality of connection carriers disposed in a vertical arrangement at a first side of said board, over both the front surface of one or more of said at least one semiconductor chip and said board in a manner which (i) electrically links said one or more of said at least one semiconductor chip and said board and (ii) electrically links one part of said board with another part thereof,
wherein at least one connection carrier of said multi-level carrier overlay is in electrical contact with one or more of said semiconductor chip,
wherein the rear surface of said one or more of said at least one semiconductor chip is affixed to said board in step (c),
wherein a first-level connection carrier of said multi-level carrier overlay is affixed, in step (b), to said one or more of said semiconductor chip and, in step (c), to said board via electrical contacts, each electrical contact effecting an interconnection between a contact location provided at a side of said first-level connection carrier facing a respective chip and an oppositely disposed one of (i) external pad on that chip and (ii) external landing at a side of said board facing said first-level connection carrier, and
wherein another, higher-level connection carrier of said multi-level carrier overlay, which overlies both said semiconductor chip and said first-level connection carrier, is at least affixed to different parts of said board via said electrical contacts.

51. A chip-to-board connection assembly according to claim 1,
wherein said board includes at least one wiring layer and a base layer, and
wherein said recessed opening has a depth extending to an inner plane surface of said base layer, said recessed opening being dimensioned so as to retrofit thereat at least said semiconductor chip, the rear surface of which is to be affixed to said inner plane surface.

52. A method according to claim 49, wherein said step of providing said board includes providing said board with wirings and with a portion acting as a heat sink of heat generated during operation of said semiconductor chip, in the assembly, the heat sink portion having an inner contact surface at a recessed opening at the first side of said board to which the rear surface of said one or more of said at least one semiconductor chip is to be affixed.

53. A method according to claim 50, wherein said step of providing said board includes providing said board with wirings and with a portion acting as a heat sink of heat generated during operation of said semiconductor chip, in the assembly, the heat sink portion having an inner contact surface at a recessed opening at the first side of said board to which the rear surface of said one or more of said at least one semiconductor chip is to be affixed.

\* \* \* \* \*